(12) United States Patent
Steudel et al.

(10) Patent No.: US 8,399,605 B2
(45) Date of Patent: Mar. 19, 2013

(54) ARYLAMINE POLYMER

(75) Inventors: Annette Steudel, Pinehurst South (GB); Nalinkumar Lallubhai Patel, Impington (GB); Jonathan Pillow, Parkside (GB); Mary McKiernan, Cottenham (GB); Sophie Heidenhain, Lower Cambourne (GB); Natasha Conway, Histon (GB)

(73) Assignees: Cambridge Display Technology Limited, Cambridgeshire (GB); CDT Oxford Limited, Cambridgeshire (GB)

( * ) Notice: Subject to any disclaimer, the term of this patent is extended or adjusted under 35 U.S.C. 154(b) by 250 days.

(21) Appl. No.: 12/158,912

(22) PCT Filed: Dec. 18, 2006

(86) PCT No.: PCT/GB2006/004774
§ 371 (c)(1),
(2), (4) Date: Aug. 6, 2008

(87) PCT Pub. No.: WO2007/071974
PCT Pub. Date: Jun. 28, 2007

(65) Prior Publication Data
US 2008/0309229 A1    Dec. 18, 2008

(30) Foreign Application Priority Data
Dec. 22, 2005  (GB) .................................. 0526186.2

(51) Int. Cl.
*C08G 73/00*    (2006.01)

(52) U.S. Cl. .......... 528/422; 313/504; 427/66; 548/440; 564/433; 564/434

(58) Field of Classification Search .................... 528/422
See application file for complete search history.

(56) References Cited

U.S. PATENT DOCUMENTS

| 5,150,006 | A | 9/1992 | Van Slyke et al. |
| 5,432,014 | A | 7/1995 | Sano et al. |
| 5,621,131 | A | 4/1997 | Kreuder et al. |
| 5,723,873 | A | 3/1998 | Yang |

(Continued)

FOREIGN PATENT DOCUMENTS

| EP | 0 506 492 A2 | 9/1992 |
| EP | 0 707 020 A2 | 4/1996 |

(Continued)

OTHER PUBLICATIONS

Bernius et al., "Progress with Light-Emitting Polymers," *Adv. Mater.*, 12(23):1737-1750 (2000).

(Continued)

*Primary Examiner* — Shane Fang
(74) *Attorney, Agent, or Firm* — Marshall, Gerstein & Borun LLP

(57) ABSTRACT

A semiconductive polymer comprising a first repeat unit in the polymer backbone comprising general formula 1:

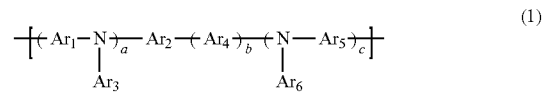

where $a=1$ or $2$; $b=0$ or $1$; and $c=0$, $1$ or $2$, provided that when $c=0$ then $b=0$; $Ar_1$, $Ar_2$, $Ar_3$, $Ar_4$, $Ar_5$, and $Ar_6$ each independently represent an aryl or heteroaryl ring or a fused derivative thereof; characterized in that at least one of $Ar_1$, $Ar_2$, $Ar_4$, and $Ar_5$ is non-conjugating; and provided that (a) when $a=1$, $Ar_1$ is not linked to $Ar_2$ by a direct bond, (b) when $b=1$ and $c=1$, $Ar_4$ is not linked to $Ar_5$ by a direct bond, (c) when $b=0$ and $c=1$, $Ar_2$ is not linked to $Ar_5$ by a direct bond, (d) when $a=2$, the $Ar_1$ groups are not linked by a single bond, and (e) when $c=2$, the $Ar_5$ groups are not linked by a single bond.

17 Claims, 1 Drawing Sheet

U.S. PATENT DOCUMENTS

| | | | |
|---|---|---|---|
| 5,798,170 | A | 8/1998 | Zhang et al. |
| 5,879,821 | A | 3/1999 | Hsieh |
| 6,083,634 | A | 7/2000 | Shi |
| 6,268,695 | B1 | 7/2001 | Affinito |
| 6,309,763 | B1 | 10/2001 | Woo et al. |
| 6,353,083 | B1 | 3/2002 | Inbasekaran et al. |
| 6,416,887 | B1 | 7/2002 | Tokito et al. |
| 6,833,200 | B2 * | 12/2004 | Senoo et al. ............... 428/690 |
| 6,955,856 | B2 | 10/2005 | Lee et al. |
| 7,030,138 | B2 | 4/2006 | Fujimoto et al. |
| 7,238,435 | B2 | 7/2007 | Kamatani et al. |
| 2002/0117662 | A1 | 8/2002 | Nii |
| 2002/0182441 | A1 | 12/2002 | Lamansky et al. |
| 2004/0121184 | A1 | 6/2004 | Thompson et al. |
| 2005/0209422 | A1 * | 9/2005 | O'Dell et al. ............. 526/310 |
| 2006/0058494 | A1 | 3/2006 | Busing et al. |
| 2006/0078757 | A1 * | 4/2006 | Boerner ................. 428/690 |
| 2009/0203876 | A1 | 8/2009 | Grand et al. |
| 2009/0206731 | A1 | 8/2009 | Leadbeater et al. |

FOREIGN PATENT DOCUMENTS

| | | | |
|---|---|---|---|
| EP | 0 880 303 A1 | 11/1998 | |
| EP | 0 901 176 A2 | 3/1999 | |
| EP | 0 947 123 A1 | 10/1999 | |
| EP | 0 949 850 A1 | 10/1999 | |
| EP | 0 953 624 A1 | 11/1999 | |
| EP | 1 043 305 A1 | 10/2000 | |
| EP | 1 245 659 A1 | 10/2002 | |
| GB | 2 348 316 A | 9/2000 | |
| JP | 3-094258 A | 4/1991 | |
| JP | 3-094259 A | 4/1991 | |
| JP | 3-094260 A | 4/1991 | |
| JP | 4-225363 A | 8/1992 | |
| JP | 6-104467 A | 4/1994 | |
| JP | 6-110228 A | 4/1994 | |
| JP | 7-301926 A | 11/1995 | |
| JP | 9-268284 A | 10/1997 | |
| JP | 10-095787 A | 4/1998 | |
| JP | 10-302960 A | 11/1998 | |
| JP | 11-185967 A | 7/1999 | |
| JP | 2002-241352 A | 8/2002 | |
| JP | 2002-324679 A | 11/2002 | |
| JP | 2003-248331 A | 9/2003 | |
| JP | 2004-210785 A | 7/2004 | |
| WO | WO-90/13148 A1 | 11/1990 | |
| WO | WO-98/10621 A1 | 3/1998 | |
| WO | WO-98/57381 A1 | 12/1998 | |
| WO | WO-99/48160 A1 | 9/1999 | |
| WO | WO-99/54385 A1 | 10/1999 | |
| WO | WO-00/27946 A1 | 5/2000 | |
| WO | WO-00/46321 A1 | 8/2000 | |
| WO | WO-00/48258 A1 | 8/2000 | |
| WO | WO-00/53656 A1 | 9/2000 | |
| WO | WO-00/55927 A1 | 9/2000 | |
| WO | WO-01/19142 A1 | 3/2001 | |
| WO | WO-01/62869 A1 | 8/2001 | |
| WO | WO-01/81649 A1 | 11/2001 | |
| WO | WO-02/10129 A2 | 2/2002 | |
| WO | WO-02/31896 A2 | 4/2002 | |
| WO | WO-02/44189 A1 | 6/2002 | |
| WO | WO-02/45466 A1 | 6/2002 | |
| WO | WO-02/066552 A1 | 8/2002 | |
| WO | WO-02/068435 A1 | 9/2002 | |
| WO | WO-02/081448 A1 | 10/2002 | |
| WO | WO-02/084759 A1 | 10/2002 | |
| WO | WO-03/018653 A1 | 3/2003 | |
| WO | WO-03/022908 A1 | 3/2003 | |
| WO | WO-2004/023573 A2 | 3/2004 | |
| WO | WO-2004/037887 A2 | 5/2004 | |
| WO | WO-2004/055129 A1 | 7/2004 | |
| WO | WO-2005/052027 A1 | 6/2005 | |

OTHER PUBLICATIONS

Blatter et al., "A Convenient Synthesis of Some (1-Alkylethenyl)arenes and Bis(1-alkylethenyl)arenes," Synthesis, 5:356-358 (1989).

Brunner et al., "Carbazole Compounds as Host Materials for Triplet Emitters in Organic Light-Emitting Diodes: Tuning the HOMO Level without Influencing the Triplet Energy in Small Molecules," J. Am. Chem. Soc., 126:6035-6042 (2004).

Bushby et al., "Coulombic Effects in Radical-Cation-Based High-Spin Polymers," Chem. Comm., 23:2641-2642 (1996).

Bushby et al., "Disjoint and Coextensive Diradical Diions," J. Chem. Soc., Perkin Trans. 2: Phys. Org. Chem., 7:1405-1414 (1997).

Chen et al., "Recent Developments in Molecular Organic Electroluminescent Materials," Macromol. Symp., 125:1-48 (1997).

Chen et al., "Triplet Exciton Confinement in Phosphorescent Polymer Light-Emitting Diodes," Appl. Phys. Lett., 82(7):1006-1008 (2003).

Cleave et al., "Harvesting Singlet and Triplet Energy in Polymer LEDs," Adv. Mater., 11(4):285-288 (1999).

Demir et al., "Role of Copper Species in the Oxidative Dimerization of Arylboronic Acids: Synthesis of Symmetrical Biaryls," J. Org. Chem., 68:10130-10134 (2003).

Goodbrand et al., "Ligand-Accelerated Catalysis of the Ullmann Condensation: Application to Hole Conducting Triarylamines," J. Org. Chem., 64:670-674 (1999).

Ikai et al., "Highly Efficient Phosphorescence from Organic Light-Emitting Devices with an Exciton-Block Layer," Appl. Phys. Lett., 79(2):156-158 (2001).

Kistenmacher et al., "A Direct Synthesis of Indolocarbazoles via New Dinitroterphenyl Precursors," J. Heterocyclic Chem., 29:1237-1239 (1992).

Lane et al., "Origin of Electrophosphorescence from a Doped Polymer Light Emitting Diode," Phys. Rev. B., 63:235206-1-235206-8 (2001).

Lee et al., "Polymer Phosphorescent Light-Emitting Devices Doped with Tris(2-phenylpyridine) Iridium as a Triplet Emitter," Appl. Phys. Lett., 77(15):2280-2282 (2000).

Niu et al., "Thermal Annealing Below the Glass Transition Temperature: A General Way to Increase Performance of Light-Emitting Diodes Based on Copolyfluorenes," Appl. Phys. Lett., 81(4):634-636 (2002).

O'Brien et al., "Electrophosphorescence from a Doped Polymer Light Emitting Diode," Synth. Met., 116:379-383 (2001).

Okada et al., "Approach to Molecular Design of Charge Transport Materials by Molecular Orbital Calculation," IS&T's Int. Congr. Adv. Non-Impact printing Technol., Final Program Proc., 8th, pp. 261-263 (1992).

Setayesh et al., "Bridging the Gap Between Polyfluorene and Ladder-Poly-$p$-phenylene: Synthesis and Characterization of Poly-2,8-indenofluorene," Macromolecules, 33:2016-2020 (2000).

van Dijken et al., "Carbazole Compounds as Host Materials for Triplet Emitters in Organic Light-Emitting Diodes: Polymer Hosts for High-Efficiency Light-Emitting Diodes," J. Am. Chem. Soc., 126:7718-7727 (2004).

Wolfe et al., "Room Temperature Catalytic Amination of Aryl Iodides," J. Org. Chem., 62:6066-6068 (1997).

Yamaguchi et al., "Effects of B and C on the Ordering of L1$_0$-CoPt Thin Films," Appl. Phys. Lett., 79(13):2001-2003 (2001).

Yamamoto, "Electrically Conducting and Thermally Stable $\pi$-Conjugated Poly(arylene)s Prepared by Organometallic Processes," Prog. Polym. Sci., 17:1153-1205 (1992).

Yang et al., "Efficient Blue Polymer Light-Emitting Diodes from a Series of Soluble Poly(paraphenylene)s," J. Appl. Phys., 79(2):934-939 (1996).

Zhu et al., "Synthesis of New Iridium Complexes and Their Electrophosphorescent Properties in Polymer Light-Emitting Diodes," J. Mater. Chem., 13:50-55 (2003).

Combined Search and Examination Report for Application No. GB0526186.2, dated Apr. 24, 2006.

European Examination Report for Application No. 06831417.8, dated May 8, 2009.

International Preliminary Report on Patentability for Application No. PCT/GB2006/004774, dated Jun. 24, 2008.

International Search Report and Written Opinion for Application No. PCT/GB2006/004774, dated Mar. 26, 2007.

* cited by examiner

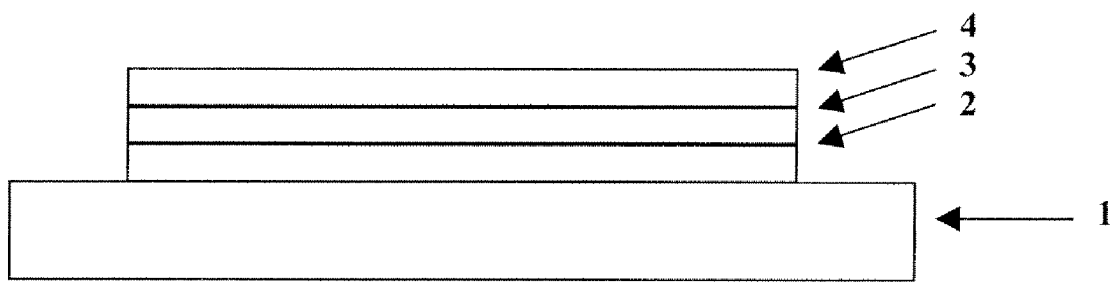

ARYLAMINE POLYMER

The present invention is concerned with an arylamine polymer and a method for making the same. The present invention also is concerned with organic electronic devices, such as light-emitting devices (LEDs), containing the amine polymer and to methods for making the same.

Organic LEDs typically comprise one or more semiconductive polymer layers located between electrodes. Semiconductive polymers are characterised by partial or substantial conjugation in the backbone and/or side chains.

Semiconductive polymers are now frequently used in polymeric light emitting devices ("PLEDs") as disclosed in WO 90/13148.

A typical LED comprises a substrate, on which is supported an anode, a cathode, and an organic light-emitting layer located between the anode and cathode and comprising at least one light-emitting material. In operation, holes are injected into the device through the anode and electrons are injected into the device through the cathode. The holes and electrons combine in the organic light-emitting layer to form an exciton, which then undergoes radiative decay to give light. Other layers may be present in the LED. For example a layer of a conducting organic hole injection material such as poly(ethylene dioxythiophene)/polystyrene sulfonate (PEDT/PSS) may be provided between the anode and the organic light-emitting layer to assist injection of holes from the anode to the organic light-emitting layer. Further, a layer of a semiconductive organic hole transport material may be provided between the anode (or the hole injection layer where present) and the organic light-emitting layer to assist transport of holes to the organic light-emitting layer.

Generally, it is desired that the polymer or polymers used in the afore-mentioned organic devices are soluble in common organic solvents to facilitate their deposition during device manufacture. Many such polymers are known. One of the key advantages of this solubility is that a polymer layer can be fabricated by solution processing, for example by spin-casting, ink-jet printing, screen-printing, dip-coating, roll printing etc. Examples of such polymers are disclosed in, for example, Adv. Mater. 2000 12(23) 1737-1750 and include polymers with at least partially conjugated backbones formed from aromatic or heteroaromatic units such as fluorenes, indenofluorenes, phenylenes, arylene vinylenes, azoles, quinoxalines, benzothiadiazoles, oxadiazoles, thiophenes, and arylamines with solubilising groups, and polymers with non-conjugated backbones such as poly(vinyl carbazole). Polyarylenes such as polyfluorenes have good film forming properties and may be readily formed by Suzuki or Yamamoto polymerisation, which enables a high degree of control over the regioregularity of the resultant polymer.

In certain devices, it can be desirable to cast multiple layers, i.e., laminates, of different materials (typically polymers) on a single substrate surface. For example, this could be to achieve optimisation of separate functions, for example electron or hole charge transport, luminescence control, photon-confinement, exciton-confinement, photo-induced charge generation, and charge blocking or storage.

In this regard, it can be useful to be able to fabricate multilayers of materials (such as polymers) to control the electrical and optical properties, for example, across the device. This can be useful for optimum device performance. Optimum device performance can be achieved, for example, by careful design of the electron and hole transport level offset, of the optical refractive index mismatch, and of the energy gap mismatch across the interface. Such heterostructures can, for example, facilitate the injection of one carrier but block the extraction of the opposite carrier and/or prevent exciton diffusion to the quenching interface. Thereby, such heterostructures can provide useful carrier and photon confinement effects.

WO99/54385 discloses copolymers containing fluorene and amine groups for use in electroluminescent devices. Amine groups of formulae II, III and IV are disclosed:

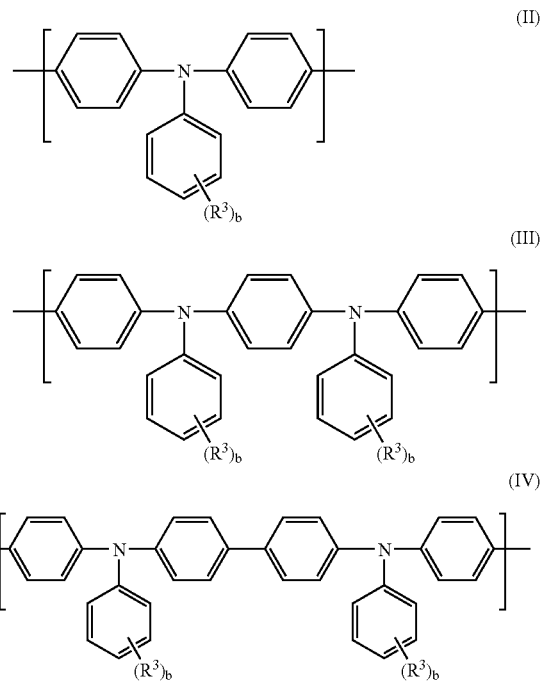

Amine-containing small molecules also are known both in the field of LEDs and outside, for example from JP 2004210785; JP 2003248331; JP 2002241352; WO 2000/027946; JP 11185967; JP 10302960; JP 10095787; JP 09268284; JP 07301926; JP 06110228; JP 06104467; EP 506492; JP 04225363; JP 03094260; JP 03094259; JP 03094258; Journal of the Chemical Society, Perkin Transactions 2: Physical Organic Chemistry (1997), (7), 1405-1414; and Chemical Communications (1996), (23), 2641-2642. An amine small molecule also is known from "Approach to molecular design of charge transport materials by molecular orbital calculation" in IS&T's Int. Congr. Adv. Non-impact printing Technol., Final Program Proc., 8th (1992), 261-3.

Crosslinkable arylamine compounds are known from WO 2005/052027.

The light-emitting layer of an LED may comprise one or more fluorescent and/or phosphorescent light-emitting materials.

In LEDs, electrons and holes are injected from opposite electrodes and are combined to form two types of excitons; spin-symmetric triplets and spin-antisymmetric singlets in a theoretical ratio of 3:1. Radiative decay from the singlets is fast (fluorescence), but from the triplets (phosphorescence) it is formally forbidden by the requirement of the spin conservation.

Initially spurred on by this understanding that the maximum internal quantum efficiency of an OLED was limited to 25% the idea of transferring both singlets and triplets to a phosphorescent dopant was conceived. Such a phosphor ideally is able to accept both singlet and triplet excitons from the organic material and generate luminescence, particularly electroluminescence from both.

In the past few years many have studied the incorporation by blending of phosphorescent materials into a semiconductive layer. Good results have been achieved for LED's based on blends incorporating a phosphorescent dopant and a host such as a small molecule or a non-conjugated polymer host such as polyvinylcarbazole.

Carbazole compounds as hosts for triplet emitters in LEDs have been the subject of several papers, including JACS 2004, 126, 7718 and JACS 2004, 126, 6035-6042. JACS 2004, 126, 7718 discloses homopolymers and copolymers based on 9,9'-dialkyl-[3,3']-bicarbazolyl. JACS 2004, 126, 6035-6042 investigates a series of small molecule carbazole derivatives based on derivatization at the phenyl rings of the carbazole unit.

One of the reasons for the lack of success with polymer hosts in multicolour LEDs is that it is difficult to find materials with a sufficiently high triplet energy level so that the host does not quench the red, green and particularly blue emission. Further, as mentioned in JACS 2004, 126, 7718, it is a real challenge to prepare a polymer that has a high triplet energy level and at the same time suitable HOMO and LUMO levels for efficient charge injection.

WO 2004/055129 is concerned with an electroluminescent device comprising a combination of charge-transporting conjugated donor compound and a phosphorescent acceptor compound. Meta-linked phenylene; 3,6 linked fluorenylene; and 3,6 carbazolyl units as odd-integer sub units are disclosed for increasing the lowest-level triplet state of a conjugated polymer chain.

In view of the above it will be understood that there remains a need to provide further host materials for phosphorescent light-emitting materials in electronic devices.

As such, it is an aim of the present invention to provide a new host material for phosphorescent light-emitting materials in electronic devices. Further it is an aim of the present invention to provide new electronic devices including the new host materials. Still further it is an aim of the present invention to provide methods for making the same.

A first aspect of the present invention provides a semiconductive polymer comprising a first repeat unit in the polymer backbone comprising general formula I:

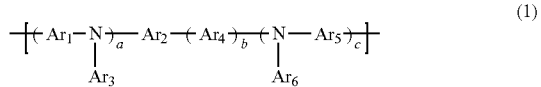

(1)

where a=1 or 2; b=0 or 1; and c=0, 1 or 2, provided that when c=0 then b=0; $Ar_1$, $Ar_2$, $Ar_3$, $Ar_4$, $Ar_5$, and $Ar_6$ each independently represent an aryl or heteroaryl ring or a fused derivative thereof; characterised in that at least one of $A_1$, $Ar_2$, $Ar_4$, and $Ar_5$ is non-conjugating; and provided that (a) when a=1, $Ar_1$ is not linked to $Ar_2$ by a direct bond, (b) when b=1 and c=1, $Ar_4$ is not linked to $Ar_5$ by a direct bond, (c) when b=0 and c=1, $Ar_2$ is not linked to $Ar_5$ by a direct bond, (d) when a=2, the $Ar_1$ groups are not linked by a single bond, and (e) when c=2, the $Ar_5$ groups are not linked by a single bond.

Preferably, a=1 and c=0 or 1.

The first aspect further provides the use of the semiconductive polymer for transporting holes in an organic electronic device. The first aspect still further provides the use of the semiconductive polymer as a host for a phosphorescent metal complex in an organic electronic device.

It has been found by the present inventors that introducing a first repeat unit of general formula 1 into a semiconductive polymer and thus decreasing the conjugation length along the polymer backbone increases the triplet energy level of the semiconductive polymer. This is advantageous for avoiding quenching when the semiconductive polymer is used as a host for a phosphorescent material in a light-emitting device, thus increasing device efficiency. Preferably, the triplet energy level is high enough so that the semiconductive polymer is suitable for use as a host for a phosphorescent green emitter. In this regard, preferably the triplet energy level is greater than 2.4 eV. In another embodiment, the semiconductive polymer is suitable for use as a host for a phosphorescent sky-blue emitter and preferably has a triplet energy level of greater than 2.6 eV. In another embodiment, the semiconductive polymer is suitable for use as a host for a phosphorescent red emitter and preferably has a triplet energy level of greater than 2.2 eV. The hole transporting properties of the semiconductive polymer also make the polymer a desirable hole transport material for use in an organic electronic device.

The present semiconductive polymer also has been found to have unexpectedly good stability when compared with other host materials. Stability is measured according to standard techniques in terms of electrochemical stability (reversible oxidation and reduction) and lifetime of a device.

A second aspect of the present invention provides a monomer for making a polymer as defined in relation to the first aspect, said monomer comprising general formula 1:

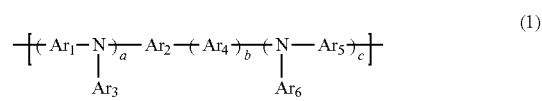

(1)

where a, b, c, $Ar_1$, $Ar_2$, $Ar_3$, $Ar_4$, $Ar_5$, and $Ar_6$ are as defined anywhere in relation to the first aspect; and at least one leaving group L directly attached to $Ar_1$ and capable of participating in polymerisation.

A third aspect of the present invention provides a method of making a semiconductive polymer as defined in relation to the first aspect, said method comprising a step of polymerising a plurality of monomers as defined in relation to the second aspect under conditions so as to form the semiconductive polymer.

A fourth aspect of the present invention provides an organic electronic device containing a semiconductive polymer as defined in relation to the first aspect. The fourth aspect further provides a method for making the same.

The present invention now will be described in more detail with reference to the attached FIGURE in which:

FIG. 1 shows a basic device structure for an LED.

Referring to the first aspect, it will be understood that by at least one of $Ar_1$, $Ar_2$, $Ar_4$ and $Ar_5$ being "non-conjugating" is meant non-conjugating along the backbone of the first repeat unit. Conjugation arises from continuous overlapping orbitals along the backbone, for example, alternating single and double carbon-carbon bonds, which leaves a continuous path of overlapping p orbitals. An example of a conjugated backbone is a poly(p-linked phenylene).

$Ar_1$, $Ar_2$, $Ar_3$, $Ar_4$, $Ar_5$, and $Ar_6$ may be selected from any suitable aryl or heteroaryl rings or fused derivatives thereof. Suitable aryl and heteroaryl rings will be known to a person skilled in this art and include, in order of preference: phenyl, naphthyl, fluorene, biphenyl, carbazole, and any 6-membered heterocycle having suitable triplet energy level for a green phosphorescent emitter. Planar rings are preferred, for example phenyl or fluorene rings. Aryl rings are preferred. 6-membered rings are preferred.

$Ar_1$, $Ar_2$, $Ar_3$, $Ar_4$, $Ar_5$ and/or $Ar_6$ may be substituted or unsubstituted. Suitable substituents include solubilising groups such as linear or branched C1-20 alkyl or alkoxy; electron withdrawing groups such as fluorine, nitro or cyano; and substituents for increasing glass transition temperature (Tg) of the polymer.

Another suitable substituent for $Ar_3$ and/or $Ar_4$ is amino, preferably a diarylamino group, thus providing amine units within the polymer backbone and amine units pendent from the polymer backbone, which may serve to improve the hole transporting and/or emissive characteristics of the polymer. The amino group may be linked directly to $Ar_3$ and/or $Ar_4$ or may be separated from $Ar_3$ and/or $Ar_4$ by a spacer group. The aryl groups of a diarylamino substituent may be as described above for $Ar_1$-$Ar_6$.

There may be additional links not shown in general formula 1 between main chain and pendent Ar rings. In this regard, $Ar_1$ may be linked to $Ar_3$. Similarly, $Ar_2$ may be linked to $Ar_3$. When c=1, $Ar_5$ may be linked to $Ar_6$. When b=1 and c=1, $Ar_4$ may be linked to $Ar_6$. When b=0 and c=1, $Ar_2$ may be linked to $Ar_6$. All of the afore-mentioned links may be by a direct bond or via a bridging group or bridging atom.

One or more of the afore-mentioned links may be present. In particular, $Ar_2$ be linked to both $Ar_3$ and $Ar_6$, for example as shown below:

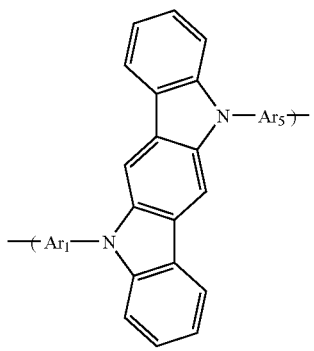

This repeat unit may derive from a monomer made from the small molecule disclosed in J. Heterocyclic Chem., 29, 1237 (1992). $Ar_1$ is not linked to $Ar_2$ by a direct bond. However, $Ar_1$ may be linked to $Ar_2$ via a bridging group or bridging atom.

Similarly, when b=1 and c=1, $Ar_4$ is not linked to $Ar_5$ by a direct bond. Further, when b=0 and c=1, $Ar_2$ is not linked to $Ar_5$ by a direct bond. However, when b=1 and c=1, $Ar_4$ may be linked to $Ar_5$ via a bridging group or bridging atom. Similarly, when b=0 and c=1, $Ar_2$ may be linked to $Ar_5$ via a bridging group or bridging atom. Further, where a=2, the two $Ar_1$ groups are not linked by a direct bond, and where c=2, the two $Ar_5$ groups are not linked by a direct bond.

These possibilities are shown in general formulae 3 to 5 below:

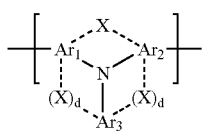

(3)

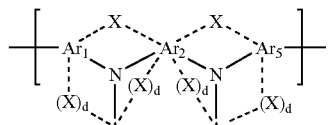

(4)

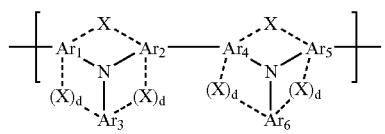

(5)

where - - - - represents a direct bond; X represents a bridging group or bridging atom; and d=0 or 1. Suitable bridging groups include (CH2)n where n is from 1 to 2. Suitable bridging atoms include O and S. In general formulae 3 to 5 one or a combination of the —X— and —(X)$_d$— links shown may be present.

Preferably, $Ar_3$ and/or $Ar_6$ (when present) has/have at least one substituent. Preferably, $Ar_3$ and/or $Ar_6$ (when present) independently represent an aryl or heteroaryl ring. When $Ar_3$ and/or $Ar_6$ represent(s) a six membered ring such as phenyl, $Ar_3$ and/or $Ar_6$ may have up to five substituents. At least one substituent located at the para position is preferred.

Preferably, $Ar_1$, $Ar_2$, $Ar_3$, $Ar_4$, $Ar_5$, and $Ar_6$ each comprise phenyl, which may be substituted or unsubstituted. For reasons of synthetic ease, substitution on $Ar_2$ and $Ar_4$ is preferred over $Ar_1$ and $Ar_5$. If the structural unit [—N—$Ar_2$—$Ar_4$—N—] is conjugated along its length then substitution in the 2,2' or 3,3' positions when $Ar_2$=$Ar_4$=6 membered ring is preferred. This is to increase twisting along the polymer backbone, thereby further decreasing conjugation.

When $Ar_1$, $Ar_2$, $Ar_4$, and/or $Ar_5$ comprises phenyl, the phenyl may be meta linked in the first repeat unit or may be fused at the meta position to another aryl or heteroaryl ring, such as another phenyl, in order to render it non-conjugating.

A meta-linked phenyl ring comprises general formula 6:

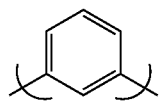

(6)

A substituent may be located at the para position in a meta linked phenyl ring:

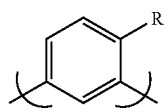

(7)

where R represents any suitable substituent as described herein. Preferred substituents include alkyl, alkoxy, and aryl. Alkyl and alkoxy are most preferred.

A fused derivative of a phenyl ring comprises general formula 8, where $Ar_7$ represents any suitable second aryl or heteroaryl ring:

(8)

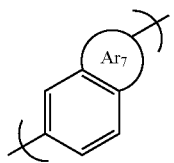

The second aryl or heteroaryl ring Ar7 preferably is a six membered ring, more preferably phenyl. The fused derivative may comprise general formula 9:

(9)

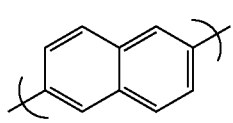

Non-fused, non-conjugated aryl or heteroaryl rings or fused derivatives thereof are preferred.

In one embodiment, the terminal Ar of the first repeat unit (i.e. $Ar_1$ and one of $Ar_2$ and $Ar_5$) preferably are non-conjugating. In this embodiment, both terminal Ar (i.e. $Ar_1$ and one of $Ar_2$ and $Ar_5$) preferably each independently represent a meta-linked phenyl group.

The first repeat unit may comprise general formula 10 or 11 or 12:

(10)

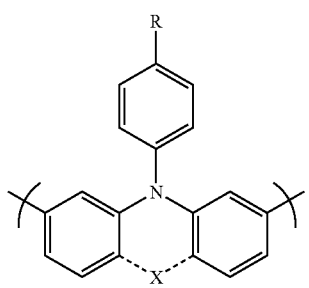

(11)

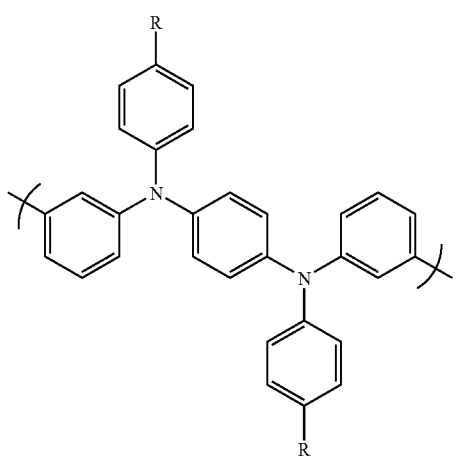

(12)

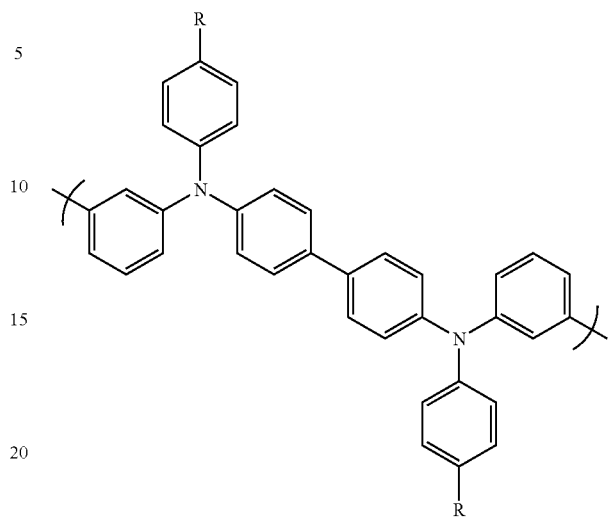

where R represents hydrogen or any suitable substituent as described herein. Preferred substituents include alkyl, alkoxy, and aryl. Alkyl and alkoxy are most preferred.

In general formula 10, the —X— link is optional. When present, X is preferably O or S.

In general formula 12, it may be desirable to increase the extent of twisting in the polymer chain by the introduction of substituents as shown for example in general formula 13:

(13)

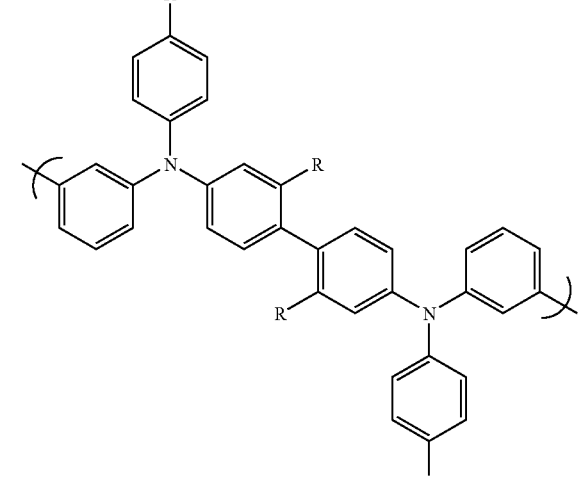

When c=1, in one embodiment, the central Ar of the first repeat unit (i.e. one or both of $Ar_2$ and $Ar_4$) preferably is non-conjugating. In this embodiment, one or both of $Ar_2$ and $Ar_4$ preferably independently represent a meta-linked phenyl.

When c=1 and b=0, in one embodiment, $Ar_2$ preferably represents a meta-linked phenyl.

The first repeat unit may comprise general formula 14:

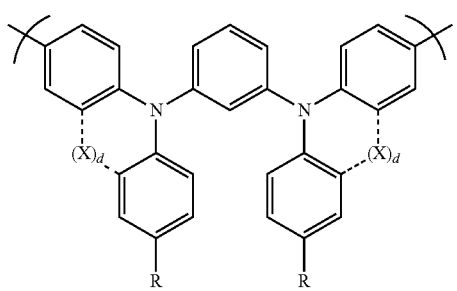

(14)

where - - - represents a direct bond; each X independently represents a bridging group or bridging atom; c=0 or 1; each R independently represents a substituent and the —(X)d- links independently are optional.

When c=1 and b=0, in another embodiment, $Ar_2$ preferably represents a fused derivative of a phenyl ring. The fused derivative may have general formula 8 or 9 as defined herein. If $Ar_1$ and $Ar_5$ are fused, $Ar_2$ has to be meta-linked (and a=0).

The first repeat unit may comprise general formula 15:

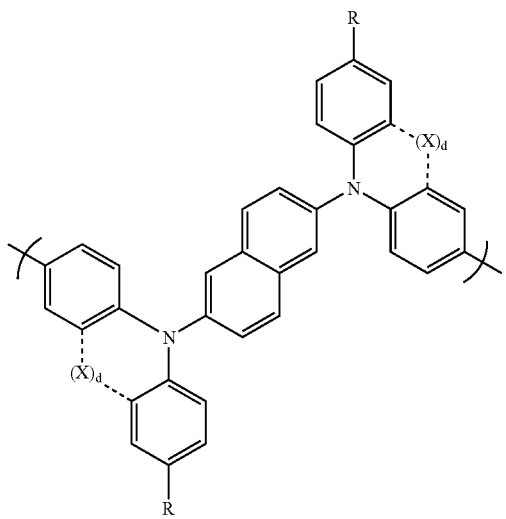

(15)

where - - - represents a direct bond; each X independently represents a bridging group or bridging atom; d=0 or 1; each R independently represents a substituent and the —(X)d- links independently are optional.

The first repeat unit as defined above may be functionalised in order to render the semiconductive polymer crosslinked. When the semiconductive polymer is crosslinked, preferably, the semiconductive polymer contains from 5 to 25 mol % crosslinking repeat units.

A substituent on $Ar_3$ and/or $Ar_6$ (for example one or both R in general formulae 10 to 12, 14 or 15) may be a functional substituent providing a cross link to another polymer chain.

The semiconductive polymer preferably is soluble so that it may be deposited as a layer by solution processing such as by ink jet printing, spin coating or roll printing. The semiconductive polymer preferably is soluble in common organic solvents, such as alkylated benzenes, in particular xylene, and toluene.

The semiconductive polymer preferably comprises conjugated segments separated by non-conjugating aryl or heteroaryl rings or fused derivatives thereof. By "non-conjugating" is meant that groups on either side of the non-conjugating aryl or heteroaryl ring or fused derivative thereof are not in conjugation with each other:

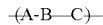

If B is non-conjugating, then A and C will not be in conjugation with each other. This may be contrasted with a conjugating aryl or heteroaryl ring or fused derivative thereof where groups on either side are in conjugation with each other.

In one embodiment, the semiconductive polymer is substantially non-conjugated.

The semiconductive polymer may comprise a homopolymer.

The semiconductive polymer may comprise a copolymer or higher order polymer. A copolymer or higher order polymer will contain one or more different co-repeat units in addition to the first repeat unit as defined herein.

When the copolymer or higher order polymer is intended for use as a hole transport polymer, preferably, the copolymer or higher order polymer contains at least 50 mol % of the first repeat unit. When the copolymer or higher order polymer is intended for use as a host, the copolymer or higher order polymer may contain up to 50 mol % of the first repeat unit if one or more of the co-repeat units are non-conjugating. More preferably, the copolymer or higher order polymer contains from 5 to 50 mol %, still more preferably from 5 to 25 mol %, of the first repeat unit.

A co-repeat unit may aid solubility of the semiconductive polymer.

Preferred co-repeat units comprise an aryl or heteroaryl group. Suitable aryl and heteroaryl groups include fluorenes, particularly 9,9 dialkyl polyfluorenes or 9,9 diaryl polyfluorenes; spirofluorenes; indenofluorenes; phenylenes; thiophenes; triarylamines; azoles, quinoxalines, oxadiazoles, and benzothiadiazoles.

Preferably a co-repeat unit which is directly linked to a first repeat unit in the semiconductive polymer is not conjugatively linked thereto. However, this is not essential.

Preferably, the co-repeat unit is comprised in a conjugated segment of the semiconductive polymer. Preferably, the conjugated segment comprises no more than four conjugating aryl or heteroaryl rings in sequence, particularly when the semiconductive polymer is intended for use as a host for a phosphorescent green emitter.

For example, the semiconductive polymer may be an AB or ABB copolymer of a first repeat unit of general formula (10) and a 2,7 linked fluorene co-repeat unit:

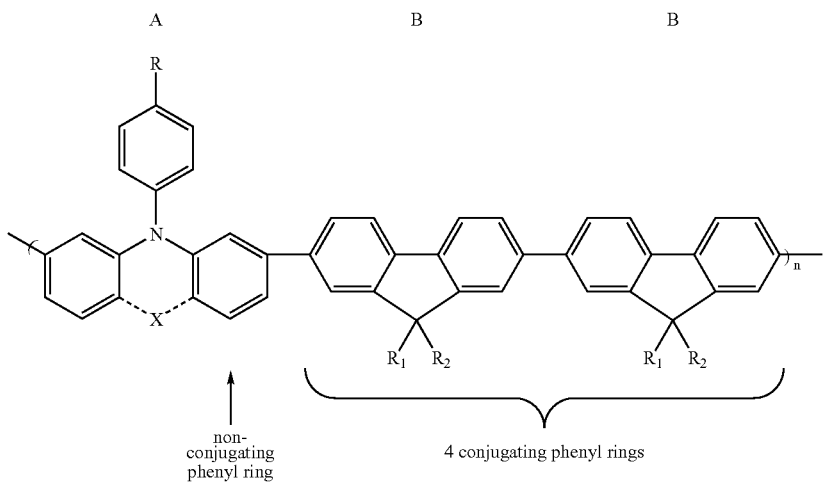

Also, the semiconductive polymer may be an AB or AAB copolymer of a first repeat unit having general formula (14) and a 3,6 linked carbazole co-repeat unit.

A preferred co-repeat unit comprises a 3,6 linked fluorene. The 3,6 linked fluorene preferably comprises general formula 16:

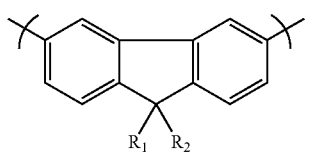

(16)

where $R_1$ and $R_2$ independently represent hydrogen or a substituent group, such as or optionally substituted alkyl (linear or branched), alkoxy (linear or branched), aryl, arylalkyl, heteroaryl and heteroarylalkyl. More preferably, at least one of $R_1$ and $R_2$ comprises an optionally substituted $C_4$-$C_{20}$ alkyl or aryl group.

A preferred copolymer according the invention is an AB copolymer of the first repeat unit and a co-repeat unit comprising a 3,6 linked fluorene.

Other suitable co-repeat units are carbazole, phenylene, biphenyl etc (see examples below)

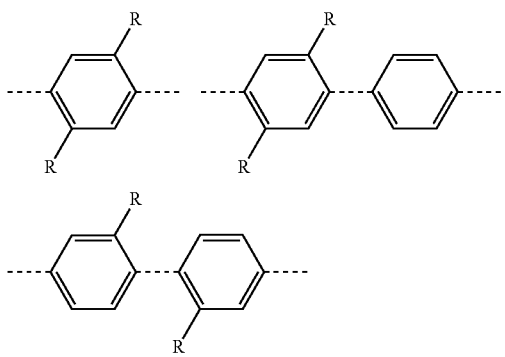

-continued

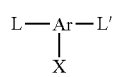

R = Alkyl, Aryl

A co-repeat unit in the semiconductive polymer may contain a crosslinking group in order to render the polymer crosslinked. Such co-repeat units may be derived from a monomer carrying a crosslinkable group, for example comprising general formula 17:

$$L-Ar-L'$$
$$|$$
$$X$$

(17)

where L and L' represent suitable reactive leaving groups; Ar represents an aryl or heteroaryl group and X represents a group comprising a terminal crosslinkable group.

Suitable crosslinkable groups include styryl, cyclobutane, and oxetane. For example, X may comprise formula 47 or 48:

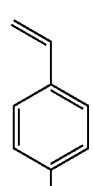

(47)

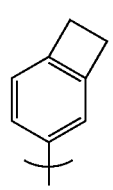

(48)

These are added as endcapping agents with reactive groups such as halogen, boronic acid, or boronic acid ester. For example, (47) and (48) may be derived from 4-vinylbromobenzene and 4-bromobenzocyclobutane respectively.

Additionally or alternatively, a low molecular weight crosslinking agent can be added at no more than 20 wt % in order to increase the crosslinking density of the polymer. An example of a low molecular weight crosslinking agent is divinylbenzene.

Examples of monomers containing a crosslinkable group include:

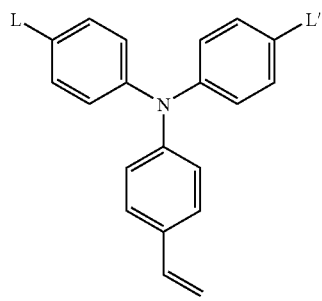

(18)

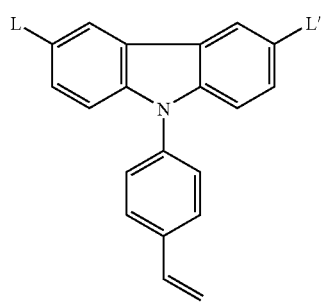

(19)

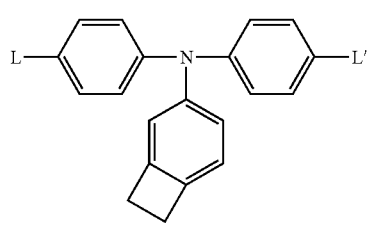

(20)

Other examples will be known to a person skilled in the art, for example from WO 2005/052027 and WO02/10129).

The semiconductive polymer preferably has a HOMO level in the range of from 4.9 to 5.5 eV, more preferably 5.0 to 5.2 eV.

The semiconductive polymer preferably contains less than 50 mol % carbazole repeat units, more preferably the semiconductive polymer contains substantially no carbazole repeat units.

Referring to a monomer according the second aspect of the present invention, a monomer preferably contains two reactive leaving groups (L and L'). Referring to formula (1), L is attached directly to $Ar_1$ and L' preferably is attached directly to $Ar_2$ (if b=c=0) or $Ar_5$ (if c=1).

It will be understood that a monomer may comprise a first repeat unit as defined in relation to the first aspect with suitable reactive leaving groups (L and L') attached to the terminals of the first repeat unit as shown below in general formula 21:

L-repeat unit-L' (21)

Monomers according to the second aspect include end capping groups having one reactive leaving group as shown in general formula 22:

L-repeat unit-Y (22)

where L is as defined above and Y represents an inert group such as hydrogen.

In general formulae 21 and 22, "repeat unit" represents a first repeat unit as defined anywhere in relation to the first aspect of the invention.

The monomer may be functionalised, for example containing a crosslinkable group. Suitably, a crosslinkable group may be present as a substituent on $Ar_3$ and/or $Ar_6$ in the monomer. For example one or both R in general formulae 10 to 12, 14 and 15, may represent a crosslinking group in a monomer having general formula 21 or 22.

Suitable crosslinking groups will be known to those skilled in the art. WO 2005/052027 discloses crosslinkable arylamine compounds. Preferred crosslinking groups include —CH=$CH_2$ and benzocyclobutane.

In general formulae 6 to 16 and 18 to 20, additional substituents to those shown may be present.

Referring to the method according to the third aspect, preferred methods for preparation of the semiconductive polymer as defined in relation to the first aspect are Suzuki polymerisation as described in, for example, WO 00/53656 and Yamamoto polymerisation as described in, for example, T. Yamamoto, "Electrically Conducting And Thermally Stable pi-Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying one or more suitable leaving groups.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

Referring to the fourth aspect of the present invention, the electronic device may comprise a light-emitting device.

With reference to FIG. 1, the architecture of an LED according to the invention comprises a transparent glass or plastic substrate 1, an anode 2 for example of indium tin oxide and a cathode 4. A light-emitting layer 3 is provided between anode 2 and cathode 4.

Further layers may be located between anode 2 and cathode 3, such as charge transporting, charge injecting or charge blocking layers.

In particular, it is desirable to provide a conductive hole injection layer formed of a doped organic material located between the anode 2 and the light-emitting layer 3 to assist hole injection from the anode into the layer or layers of semiconducting polymer. Examples of doped organic hole injection materials include poly(ethylene dioxythiophene) (PEDT), in particular PEDT doped with polystyrene sulfonate (PSS) as disclosed in EP 0901176 and EP 0947123, or polyaniline as disclosed in U.S. Pat. No. 5,723,873 and U.S. Pat. No. 5,798,170.

If present, a hole transporting layer located between anode 2 and light-emitting layer 3 preferably has a HOMO level of less than or equal to 5.5 eV, more preferably around 4.8-5.5 eV.

If present, an electron transporting layer located between light-emitting layer 3 and cathode 4 preferably has a LUMO level of around 3-3.5 eV.

It is envisaged that the semiconductive polymer according to the first aspect will be situated in a light-emitting layer of the device or in a hole transport layer. This will depend on the function of the semiconductive polymer in the device. When the semiconductive polymer is used as a light-emitting material, it may be located in a light-emitting layer of the device alone or in combination with charge-transporting materials. When the semiconductive polymer is used as a hole transport material, it may be located in a light-emitting layer of the device (in combination with a light-emitting material) or in a hole transport layer. When the semiconductive polymer is used as a host for a light emitting dopant, in particular a phosphorescent material, it will be located in a light-emitting layer of the device together with the dopant material.

When the semiconductive polymer is used as a hole transport material, light-emitting layer 3 may consist of a light-emitting material alone or may comprise the light-emitting material in combination with one or more further materials. In particular, the light-emitting material may be blended with hole and/or electron transporting materials as disclosed in, for example, WO 99/48160. Alternatively, the light-emitting material may be covalently bound to a charge transporting material.

When the semiconductive polymer is used as a hole transport material, the light-emitting material may be fluorescent or phosphorescent. The light-emitting material may comprise a polymer or a small molecule, such as a metal complex.

When the semiconductive polymer is used as a hole transport material, suitable light-emitting polymers for use in layer 3 typically are conjugated polymers and include poly(arylene vinylenes) such as poly(p-phenylene vinylenes) and polyarylenes such as: polyfluorenes, particularly 2,7-linked 9,9 dialkyl polyfluorenes or 2,7-linked 9,9 diaryl polyfluorenes; polyspirofluorenes, particularly 2,7-linked poly-9,9-spirofluorene; polyindenofluorenes, particularly 2,7-linked polyindenofluorenes; polyphenylenes, particularly alkyl or alkoxy substituted poly-1,4-phenylene. Such polymers as disclosed in, for example, Adv. Mater. 2000 12(23) 1737-1750 and references therein. Suitable light-emitting polymers are discussed in further detail below in relation to conjugated polymers.

Suitable metal complexes for use in light-emitting layer 3 are discussed below. It will be appreciated that the phosphorescent metal complexes discussed below may be used in the present device (a) in the embodiment when the present semiconductive polymer is used as a hole transport material and (b) in the embodiment when the present semiconductive polymer is used as a host for the phosphorescent metal complex. When the present semiconductive polymer is used as a hole transport material, an additional host material for the phosphorescent metal complex may be present.

Numerous hosts suitable for use as the additional host material are described in the prior art including "small molecule" hosts such as 4,4'-bis(carbazol-9-yl)biphenyl), known as CBP, and (4,4',4''-tris(carbazol-9-yl)triphenylamine), known as TCTA, disclosed in Ikai et al. (Appl. Phys. Lett., 79 no. 2, 2001, 156); and triarylamines such as tris-4-(N-3-methylphenyl-N-phenyl)phenylamine, known as MTDATA. Polymers are also known as hosts, in particular homopolymers such as poly(vinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7), 1006; poly[4-(N-4-vinylbenzyloxyethyl, N-methylamino)-N-(2,5-di-tert-butylphenyl-napthalimide] in Adv. Mater. 1999, 11(4), 285; and poly (para-phenylenes) in J. Mater. Chem. 2003, 13, 50-55. Copolymers are also known as hosts.

Suitable metal complexes comprise optionally substituted complexes of general formula 23:

$$ML^1_qL^2_rL^3_s \qquad (23)$$

wherein M is a metal; each of $L^1$, $L^2$ and $L^3$ is a coordinating group; q is an integer; r and s are each independently 0 or an integer; and the sum of $(a \cdot q)+(b \cdot r)+(c \cdot s)$ is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet states (phosphorescence). Suitable heavy metals M include:

lanthanide metals such as cerium, samarium, europium, terbium, dysprosium, thulium, erbium and neodymium; and d-block metals, in particular those in rows 2 and 3 i.e. elements 39 to 48 and 72 to 80, in particular ruthenium, rhodium, palladium, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals form organometallic complexes with carbon or nitrogen donors such as porphyrin or bidentate ligands of general formula 24:

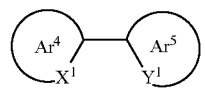

(24)

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of bidentate ligands are illustrated below:

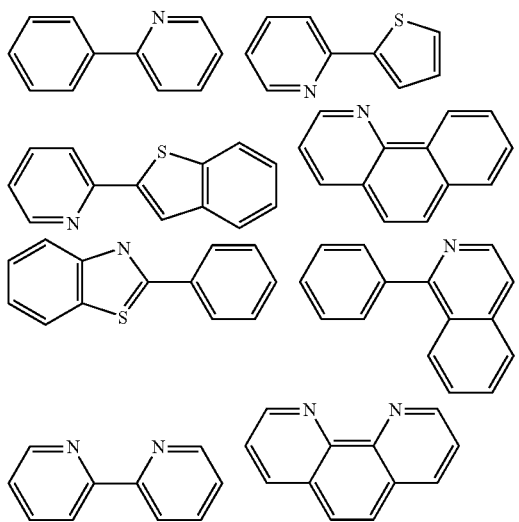

Each of Ar⁴ and Ar⁵ may carry one or more substituents. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

Other ligands suitable for use with d-block elements include diketonates, in particular acetylacetonate (acac); tri-arylphosphines and pyridine, each of which may be substituted.

Main group metal complexes show ligand based, or charge transfer emission. For these complexes, the emission colour is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known and have been demonstrated in organic light emitting devices [see, e.g., Macromol. Sym. 125 (1997) 1-48, U.S. Pat. No. 5,150,006, U.S. Pat. No. 6,083,634 and U.S. Pat. No. 5,432,014], in particular tris-(8-hydroxyquinoline)aluminium. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), Schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission colour.

In the embodiment when the present semiconductive polymer is used as a host for the phosphorescent metal complex, the phosphorescent metal complex preferably is a red, green or sky-blue phosphorescent material Examples of red, green and sky-blue phosphorescent materials are:

Red: Irpiq (piq=2-amino-1-methyl-6-phenylimidazo (4,5-b)pyridine),

Green: Irppy (ppy=3-phenylpyruvic acid),

Sky-blue: Flrpic (pic=6-(difluoro-phosphono-methyl)-napthalene-2-carboxylic acid) (e.g. as disclosed in US2004/0121184)].

The triplet energy level of the present semiconductive polymer should be higher than that of the phosphorescent metal complex.

By "red phosphorescent material" is meant an organic material that by phosphorescence emits radiation having a wavelength in the range of 600-750 nm, preferably 600-700 nm, more preferably 610-650 nm and most preferably having an emission peak around 650-660 nm.

By "green phosphorescent material" is meant an organic material that by phosphorescence emits radiation having a wavelength in the range of 510-580 nm, preferably 510-570 nm.

By "sky-blue phosphorescent material" is meant an organic material that by phosphorescence emits radiation having a wavelength in the range of 450-490 nm, preferably 460-480 nm.

In the embodiment where the semiconductive polymer is used as a host for a phosphorescent material, the semiconductive polymer may be blended with the phosphorescent material or may be chemically bonded thereto, such as in one of the manners described above.

Cathode 4 is selected from materials that have a workfunction allowing injection of electrons into the light-emitting layer. Other factors influence the selection of the cathode such as the possibility of adverse interactions between the cathode and the light-emitting material. The cathode may consist of a single material such as a layer of aluminium. Alternatively, it may comprise a plurality of metals, for example a bilayer of calcium and aluminium as disclosed in WO 98/10621, elemental barium disclosed in WO 98/57381, Appl. Phys. Lett. 2002, 81(4), 634 and WO 02/84759 or a thin layer of dielectric material to assist electron injection, for example lithium fluoride disclosed in WO 00/48258 or barium fluoride, disclosed in Appl. Phys. Lett. 2001, 79(5), 2001. In order to provide efficient injection of electrons into the device, the cathode preferably has a workfunction of less than 3.5 eV, more preferably less than 3.2 eV, most preferably less than 3 eV.

Light-emitting devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

In a practical device, at least one of the electrodes is semi-transparent in order that light may be absorbed (in the case of a photoresponsive device) or emitted (in the case of an OLED). Where the anode is transparent, it typically comprises indium tin oxide. Examples of transparent cathodes are disclosed in, for example, GB 2348316.

The embodiment of FIG. 1 illustrates a device wherein the device is formed by firstly forming an anode on a substrate followed by deposition of a light-emitting layer and a cathode, however it will be appreciated that the device of the invention could also be formed by firstly forming a cathode on a substrate followed by deposition of a light-emitting layer and an anode.

Conjugated polymers are generally useful in organic electronic devices. Conjugated polymers preferably comprise a repeat unit selected from arylene repeat units, in particular: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Particularly preferred conjugated polymers comprise optionally substituted, 2,7-linked fluorenes, most preferably repeat units of general formula 25:

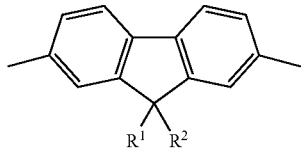

(25)

wherein $R^1$ and $R^2$ are independently selected from hydrogen or optionally substituted alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

A polymer comprising a repeat unit comprising optionally substituted, 2,7-linked fluorene may provide one or more of the functions of hole transport, electron transport and emission depending on which layer of the device it is used in and the nature of co-repeat units.

In particular:

a homopolymer of a repeat unit comprising optionally substituted, 2,7-linked fluorene, such as a homopolymer of 9,9-dialkylfluoren-2,7-diyl, may be utilised to provide electron transport.

a copolymer comprising a repeat unit comprising optionally substituted, 2,7-linked fluorene and a triarylamine repeat unit, in particular a repeat unit selected from general formulae 26-31, may be utilised to provide hole transport and/or emission:

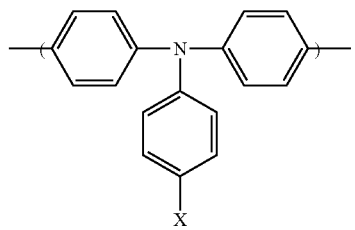

26

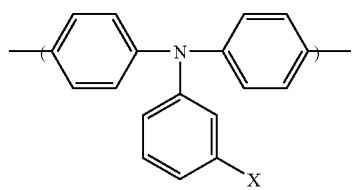

27

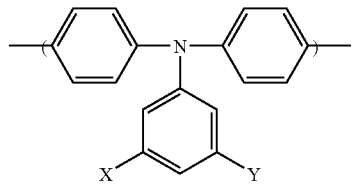

28

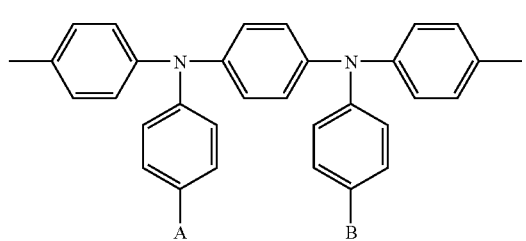

29

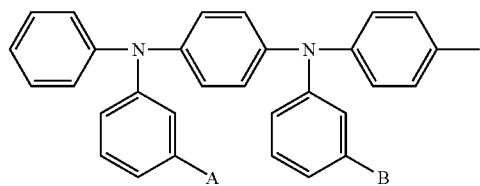

30

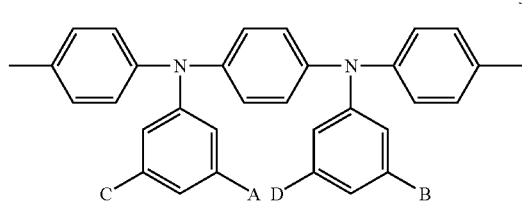

31 wherein X, Y, A, B, C and D are independently selected from H or a substituent group. More preferably, one or more of X, Y, A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, X, Y, A and B are $C_{1-10}$ alkyl.

Particularly preferred hole transporting polymers of this type are AB copolymers of the repeat unit comprising optionally substituted, 2,7-linked fluorene and a triarylamine repeat unit.

a copolymer comprising a repeat unit comprising optionally substituted, 2,7-linked fluorene and heteroarylene repeat unit may be utilised for charge transport or emission. Preferred heteroarylene repeat units are selected from general formulae 32-46:

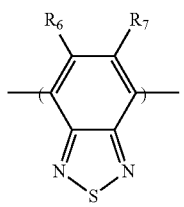
(32)

wherein $R_6$ and $R_7$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.

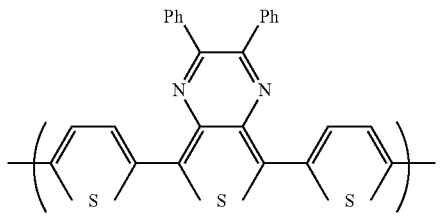
33

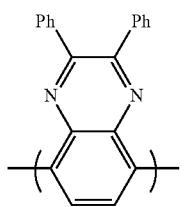
34

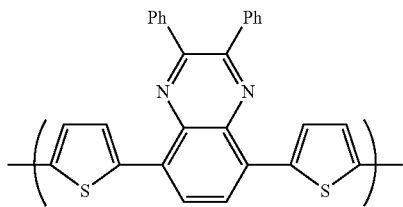
35

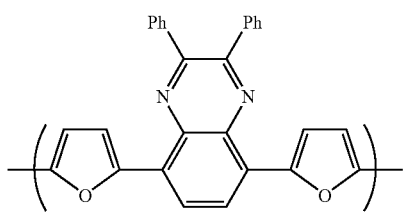
36

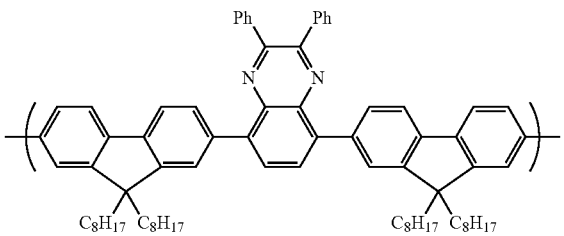
37

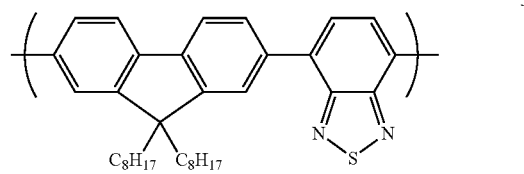
38

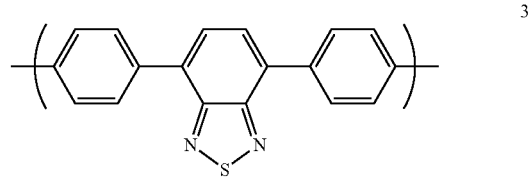
39

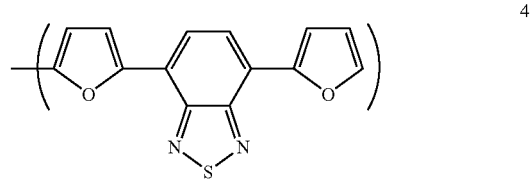
40

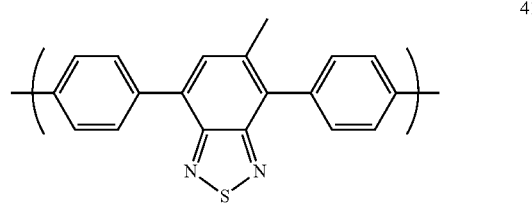
41

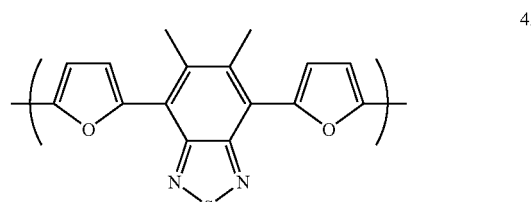
42

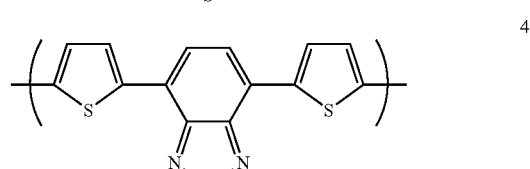
43

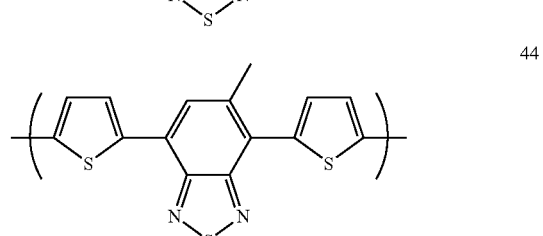
44

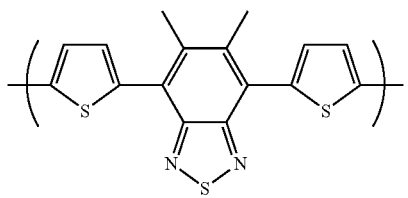

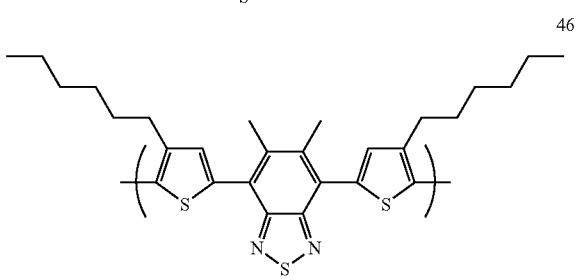

Light-emitting copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality.

The different regions within such a polymer may be provided along the polymer backbone, as per U.S. Pat. No. 6,353,083, or as groups pendant from the polymer backbone as per WO 01/62869.

Methods of making devices according to the fourth aspect will be known to the skilled person. Typically, polymer layers will be deposited by solution processing. A single polymer or a plurality of polymers may be deposited from solution to form layer 5. Suitable solvents for polyarylenes, in particular polyfluorenes, include mono- or poly-alkylbenzenes such as toluene and xylene. Particularly preferred solution deposition techniques are spin-coating, roll printing and inkjet printing.

Spin-coating is particularly suitable for devices wherein patterning of the light-emitting material is unnecessary—for example for lighting applications or simple monochrome segmented displays.

Inkjet printing is particularly suitable for high information content displays, in particular full colour displays. Inkjet printing of OLEDs is described in, for example, EP 0880303.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

When the present semiconductive polymer is used as a hole transport material in a hole transport layer of the device, the layer may be crosslinked before depositing the next layer of the device thereon. Alternatively, the hole transport layer may be treated, for example by heat, as described in WO 2004/023573.

Syntheses of monomers are described below. Starting materials are available from the Sigma-Aldrich Company.

EXAMPLE 1

Synthesis of Monomer 1 According to the Invention

Monomer 1 was prepared according to the "selective" Buchwald reaction described in Wolfe, J P; Buchwald, S L; J. Org. Chem. 1997, 62, 6066-6068.

EXAMPLE 2

Synthesis of Monomer 2 According to the Invention

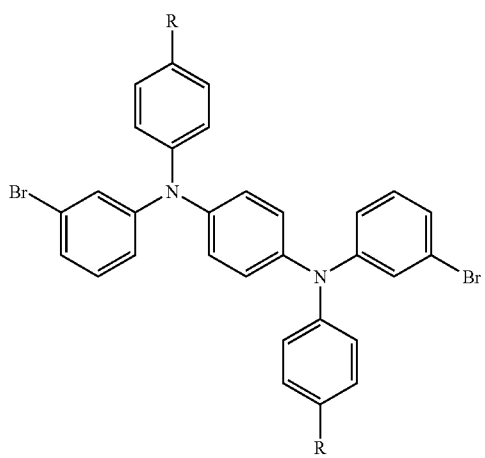

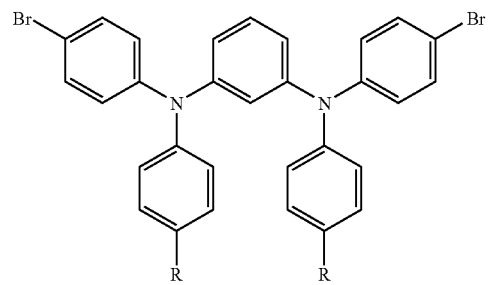

Conditions for the Ullmann reaction are as described in Goodbrand, H B; Hu, N-X; J. Org. Chem. 1999, 64, 670-674.

This is an example of a monomer comprising internal meta-links, that is a monomer which, when present as a repeat unit in a polymer, will provide meta-links along the polymer backbone that are located away from the extremities of the repeat unit.

step (i): "standard" Buchwald conditions: toluene, 1 mol % Pd(OAc)$_2$, 5 mol % tri(tert-butylphenyl)phosphine, K$_2$CO$_3$, reflux.

step (ii): selective Buchwald reaction as per Monomer Example 1.

Monomer 2 is an example of a monomer comprising a meta-link at the end of the monomer, i.e. at the bond which links to an adjacent repeat unit when in a polymer chain.

EXAMPLE 3

Synthesis of Monomer 3 According to the Invention

N-(4-alkylphenyl)aniline was brominated using N-bromosuccinimide (NBS) in dichloromethane to produce N-(4-bromophenyl)-N-(4-alkylphenyl)amine, which was reacted with 1,3-diiodobenzene according to the scheme below:

EXAMPLE 4

Synthesis of Monomer 4 According to the Invention

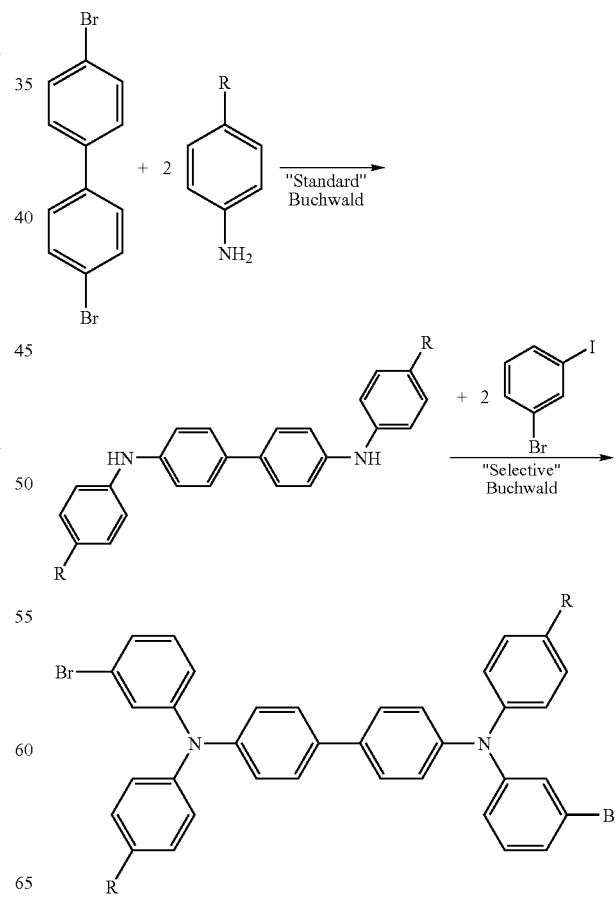

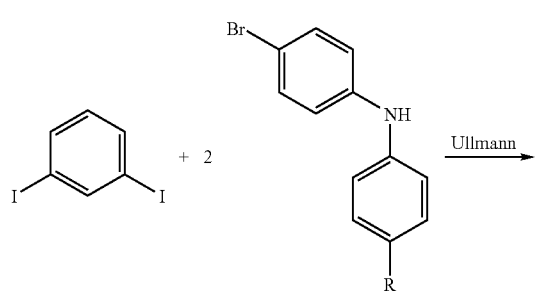

The central biphenyl unit of Monomer 4 can be substituted in 2,2' or 3,3' position to increase twist and thus further reduce conjugation.

EXAMPLE 5

Synthesis of Monomer 5 According to the Invention

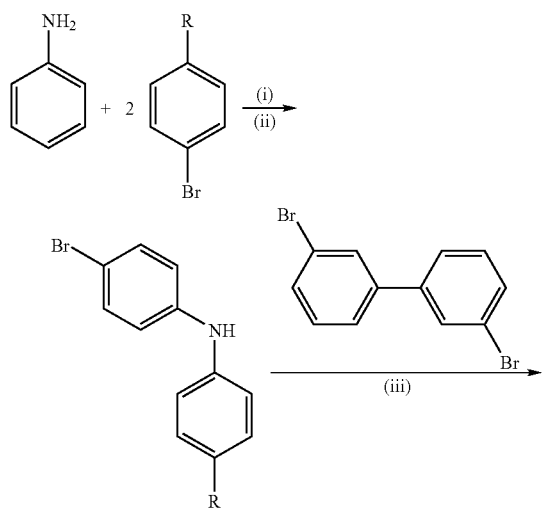

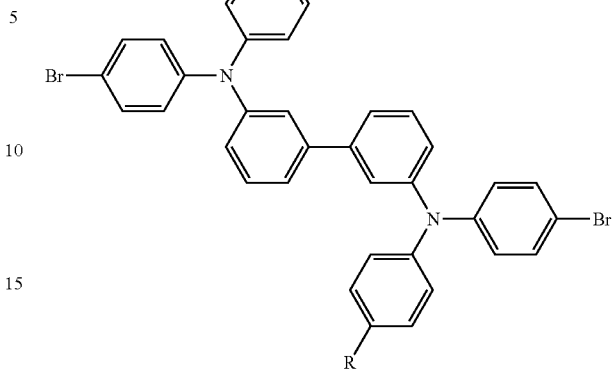

Steps (i) and (iii): standard Buchwald conditions.
Step (ii): bromination using NBS in dichloromethane.

EXAMPLE 6

Synthesis of Monomer 6 According to the Invention 3,3'-dibromobiphenyl was prepared according to the method of Demir, A S, Reis, O, Erullahoglu, M, J. Org. Chem. 2003, 62, 10130-10134, and reacted according to the following scheme:

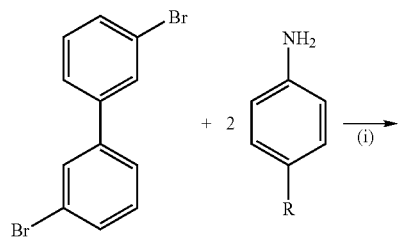

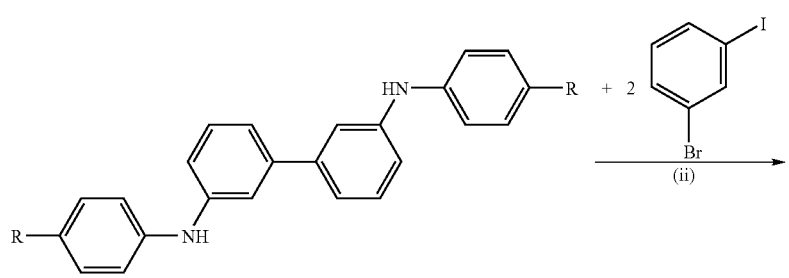

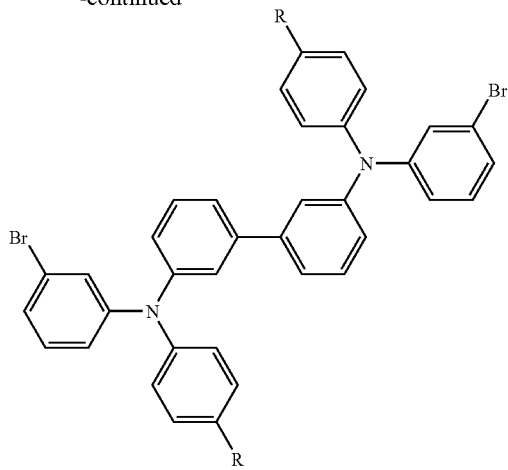

Step (i): standard Buchwald conditions.
Step (ii): selective Buchwald conditions

EXAMPLE 7

Synthesis of Monomer 7 According to the Invention

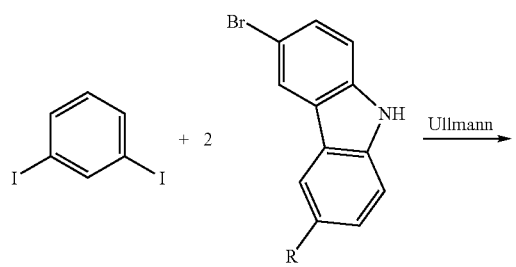

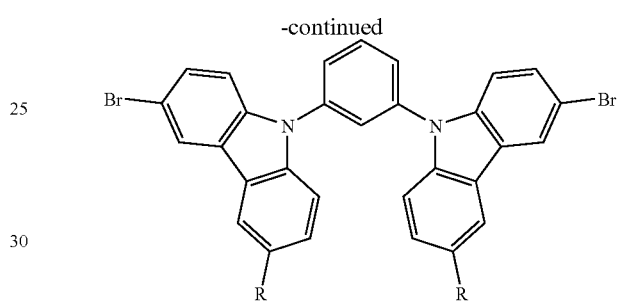

Ullmann reaction conditions as above.

EXAMPLE 8

Synthesis of Monomer 8 According to the Invention 3,6-dibromonaphthalene was prepared according to the method of Blatter, K; Schlueter, A-D; Synthesis 1989, 5, 356, and reacted according to the following scheme:

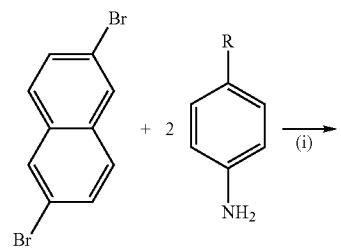

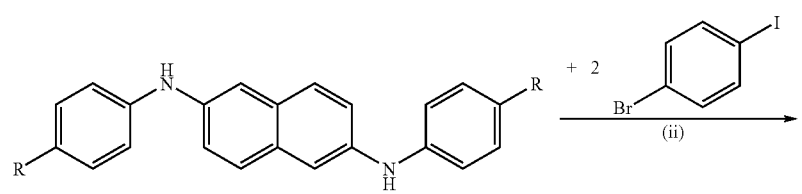

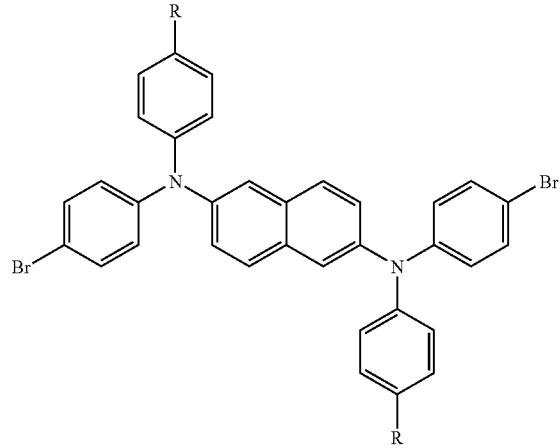
Step (i): standard Buchwald reaction conditions.
Step (ii): selective Buchwald reaction conditions
EXAMPLE 9
Synthesis of Monomer 9 According to the Invention
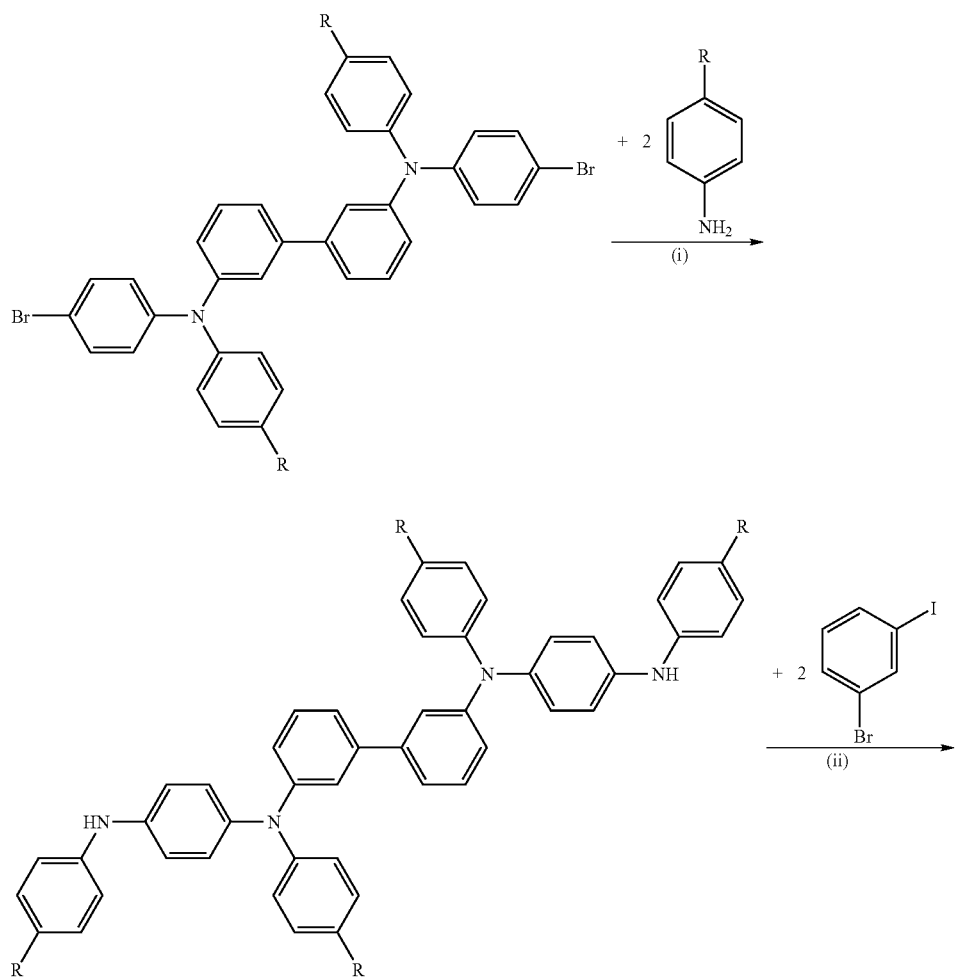

-continued

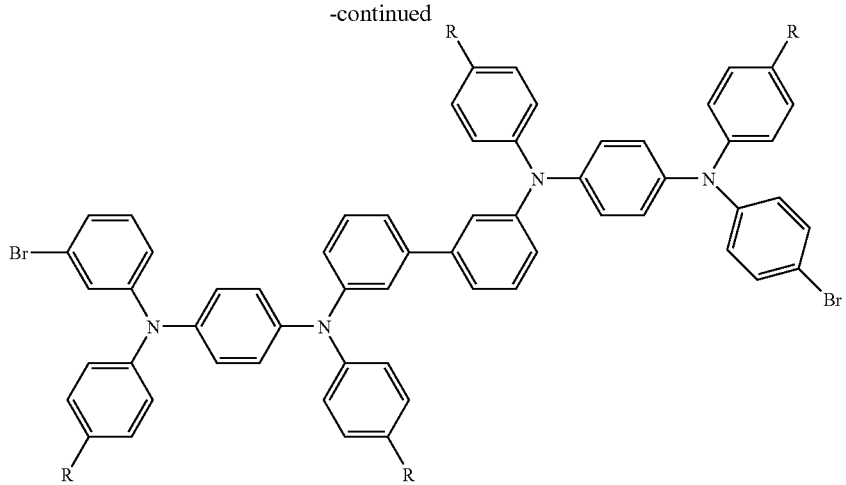

Synthesis of starting material: see Example 6.
Step (i): standard Buchwald conditions.
Step (ii): selective Buchwald conditions

EXAMPLES 10-18

Synthesis of Polymers 1-9 According to the Invention

Copolymers 1-9 were formed by Suzuki polymerisation of fluorene units with repeat units derived from Monomers 1-9 in accordance with the method set out in WO 00/53656.

EXAMPLE 19

Use as a Hole Transport Material in an LED

Poly(ethylene dioxythiophene)/poly(styrene sulfonate) (PEDT/PSS), available from H C Starck of Leverkusen, Germany as Baytron P® is deposited over an indium tin oxide anode supported on a glass substrate (available from Applied Films, Colorado, USA) by spin coating. A hole transporting layer of Polymer 1 is deposited over the PEDT/PSS layer by spin coating from xylene solution to a thickness of about 10 nm and heated at 180° C. for 1 hour. The emissive material is deposited over the layer of Polymer 1 by spin-coating from xylene solution to a thickness of around 65 nm. A Ba/Al cathode is formed over the emissive layer by evaporating a first layer of barium to a thickness of up to about 10 nm and a second layer of aluminium barium to a thickness of about 100 nm over the semiconducting polymer. Finally, the device is sealed using a metal enclosure containing a getter that is placed over the device and glued onto the substrate in order to form an airtight seal.

In the case of a fluorescent emissive layer, the red, green and/or blue electroluminescent materials comprising fluorene repeat units as described in WO 00/46321 may be used.

In the case of a phosphorescent emissive layer a blend of a host material such as CBP (4,4'-Bis(carbazol-9-yl)biphenyl) and an iridium complex, e.g. the dendrimeric complex 47 illustrated below as disclosed in WO 02/066552, may suitably be used as the phosphorescent emissive layer.

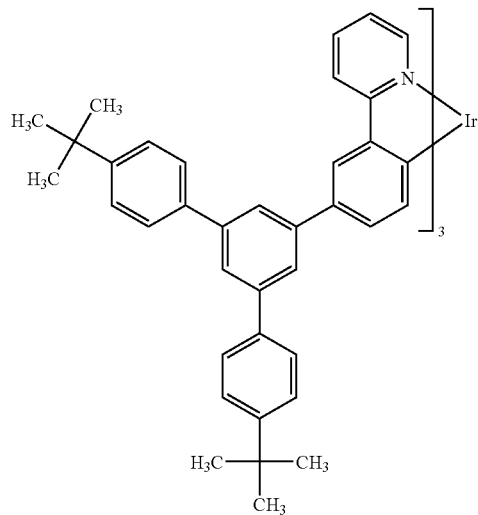

EXAMPLE 20

Use as a Host in a Green LED

Poly(ethylene dioxythiophene)/poly(styrene sulfonate) (PEDT/PSS), available from H C Starck of Leverkusen, Germany as Baytron P® is deposited over an indium tin oxide anode supported on a glass substrate (available from Applied Films, Colorado, USA) by spin coating from xylene solution to a thickness of about 10 nm and heated at 180° C. for 1 hour. A solution of hole transporting Polymer 1 is deposited over the PEDT/PSS layer by spin coating from xylene solution to a thickness of about 10 nm and heated at 180° C. for 1 hour. A solution of Polymer 2 according to the invention together with dendrimeric metal complex 47 is deposited over the layer of PEDT/PSS by spin-coating from xylene solution to a thickness of around 65 nm. A Ba/Al cathode is formed thereover by evaporating a first layer of barium to a thickness of up to about 10 nm and a second layer of aluminium barium to a thickness of about 100 nm. Finally, the device is sealed using a metal enclosure containing a getter that is placed over the device and glued onto the substrate in order to form an airtight seal.

The invention claimed is:

1. A semiconductive polymer comprising a first repeat unit in the polymer backbone comprising general formula I and a co-repeat unit comprising an aryl group or a heteroaryl group:

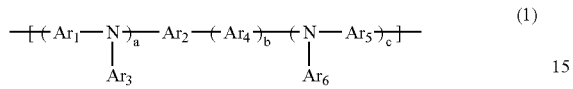

(1)

where a=1 or 2; b=0 such that $Ar_4$ is not present; and c=1 or 2; $Ar_1$, $Ar_3$, $Ar_5$, and $Ar_6$ each independently represent an aryl or heteroaryl ring or a fused derivative thereof; $Ar_2$ represents a 6-membered aryl or heteroaryl ring or a fused derivative thereof; provided that (a) when a=1, $Ar_1$ is not linked to $Ar_2$ by a direct bond, (b) when c=1, $Ar_2$ is not linked to $Ar_5$ by a direct bond, (c) when a=2, the $Ar_1$ groups are not linked by a single bond, and (d) when c=2, the $Ar_5$ groups are not linked by a single bond, wherein at least one of $Ar_1$, $Ar_2$, and $Ar_5$ is non-conjugating along the polymer backbone.

2. A polymer according to claim 1, wherein the first repeat unit comprises general formula 4 below:

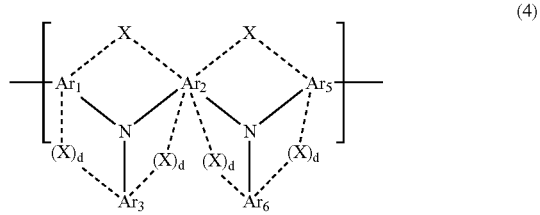

(4)

where $Ar_1$, $Ar_2$, $Ar_3$, $Ar_5$ and $Ar_6$ are as defined in claim 1; - - - represents a direct bond; X represents a bridging group or bridging atom; and d=0 or 1, where one or a combination of the —X— and —(X)$_d$— links shown are present.

3. A polymer according to claim 1, wherein $Ar_3$ and/or $Ar_6$ has at least one substituent.

4. A polymer according to claim 1, wherein $Ar_1$, $Ar_2$, $Ar_3$, $Ar_5$, and $Ar_6$ each comprise phenyl.

5. A polymer according to claim 1, wherein one terminal group of the first repeat unit is $Ar_1$ and the other terminal group is $Ar_5$, and wherein both terminal groups are non-conjugating along the polymer backbone.

6. A polymer according to claim 5, wherein both terminal groups of the first repeat unit independently represent a meta-linked phenyl group.

7. A polymer according to claim 6, wherein the first repeat unit comprises general formula 11:

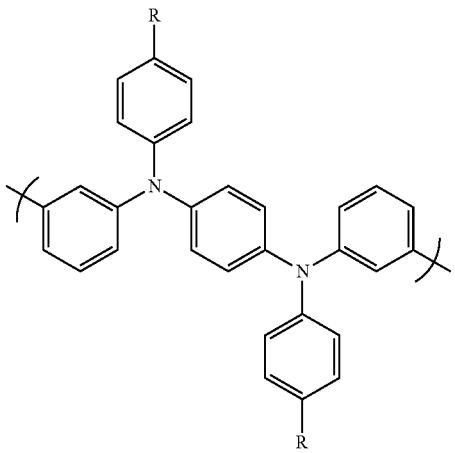

(11)

where R represents hydrogen or a substituent.

8. A polymer according to claim 1, wherein $Ar_2$ is non-conjugating.

9. A polymer according to claim 8, wherein, when c=1, $Ar_2$ represents a meta-linked phenyl.

10. A polymer according to claim 9, wherein the first repeat unit comprises general formula 14:

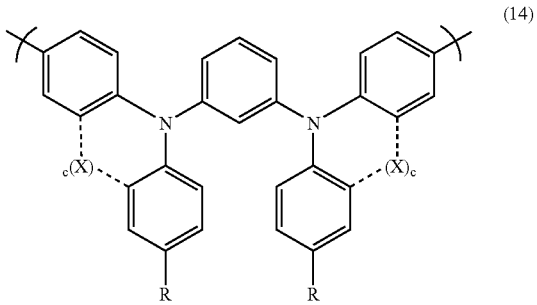

(14)

where - - - represents a direct bond; each X independently represents a bridging group or bridging atom; c=0 or 1; each R independently represents a substituent and the —(X)$_c$— links independently are optional.

11. A polymer according to claim 1, wherein the semiconductive polymer is substantially non-conjugated.

12. An organic electronic device containing a semiconductive polymer as defined in claim 1.

13. A method for making an electronic device, said method including a step of depositing a solution containing a semiconductive polymer as defined in claim 1 by solution processing to form a layer.

14. A polymer according to claim 1 wherein one of the terminal groups of the first repeat unit is non-conjugating along the polymer backbone.

15. A polymer according to claim 1 wherein the co-repeat unit is selected from the group consisting of fluorenes, spirofluorenes, indenofluorenes; phenylenes, thiophenes, triarylamines, azoles, quinoxalines, oxadiazoles, and benzothiadiazoles.

16. A polymer according to claim 1, wherein the first repeat unit is provided in an amount from 5 mol % to 25 mol %.

17. A polymer according to claim 1, wherein $Ar_2$ represents fluorene.

* * * * *